United States Patent
Kobayashi (10) Patent No.: US 12,470,175 B2
(45) Date of Patent: Nov. 11, 2025

(54) AUTONOMOUS ANALOG ORTHOGONAL LOAD MODULATION POWER AMPLIFIER

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 758 days.

(21) Appl. No.: 17/844,944

(22) Filed: Jun. 21, 2022

(65) Prior Publication Data

US 2023/0109932 A1 Apr. 13, 2023

Related U.S. Application Data

(60) Provisional application No. 63/254,243, filed on Oct. 11, 2021.

(51) Int. Cl.
*H03F 1/02* (2006.01)
*H03F 3/195* (2006.01)
(Continued)

(52) U.S. Cl.
CPC ........... *H03F 1/0288* (2013.01); *H03F 3/195* (2013.01); *H03F 3/245* (2013.01); *H03F 3/602* (2013.01);
(Continued)

(58) Field of Classification Search
CPC .......... H03F 5/00; H03F 3/45475; H03F 3/44; H03F 3/28; H03F 3/602; H03F 7/02;
(Continued)

(56) References Cited

U.S. PATENT DOCUMENTS 9,484,865 B2 11/2016 Kobayashi et al.
9,774,299 B2 * 9/2017 Staudinger ............ H03F 1/3282
(Continued)

FOREIGN PATENT DOCUMENTS

CN 102355198 A 2/2012
CN 104579186 A 4/2015
(Continued)

OTHER PUBLICATIONS

Nash, et.al, RMS detector for RF power and return loss measurement, Analogue Dialogue 52-05, May 2018 (Year: 2018).*
(Continued)

*Primary Examiner* — Hafizur Rahman
(74) *Attorney, Agent, or Firm* — Withrow & Terranova, P.L.L.C.

(57) ABSTRACT

A load modulation amplifier is disclosed having a first amplifier and a second amplifier. An input quadrature coupler and an output quadrature coupler are coupled between the first amplifier and the second amplifier. A splitter has a first splitter output, a splitter input coupled to a signal input, and a second splitter output coupled to a second port of the input quadrature coupler, and a variable attenuator is coupled between the first splitter output and a first port of the input quadrature coupler. An attenuation controller has a controller output that is coupled to an attenuation control input of the variable attenuator, wherein the attenuation controller autonomously generates a control signal in response to a power sample signal in proportion to a radio frequency signal received at the radio frequency signal input.

21 Claims, 8 Drawing Sheets (51) Int. Cl.
  *H03F 3/24* (2006.01)
  *H03F 3/60* (2006.01)
(52) U.S. Cl.
  CPC .. *H03F 2200/192* (2013.01); *H03F 2200/204* (2013.01); *H03F 2200/451* (2013.01)
(58) Field of Classification Search
  CPC .......... H03F 3/45085; H03F 3/26; H03F 3/88; H03F 1/14; H03F 3/21; H03F 2200/372; H03F 3/68; H03G 1/0023; H03G 1/00; H01L 2924/3011
  USPC ....... 330/3, 69, 74, 116, 117, 124, 134, 252, 330/254, 262, 275, 284, 292, 2, 95, 301, 330/307, 124 R; 375/296–297; 455/114.3
  See application file for complete search history.

(56) References Cited

U.S. PATENT DOCUMENTS

| | | | |
|---|---|---|---|
| 9,887,671 | B2 | 2/2018 | Kobayashi et al. |
| 9,948,243 | B2 | 4/2018 | Kobayashi et al. |
| 10,389,311 | B1 | 8/2019 | Kobayashi |
| 2011/0183636 | A1 | 7/2011 | Staudinger et al. |
| 2012/0105147 | A1 | 5/2012 | Harris et al. |
| 2014/0159818 | A1 | 6/2014 | Jeon et al. |
| 2014/0375389 | A1 | 12/2014 | Jeon et al. |
| 2015/0091653 | A1 | 4/2015 | Kobayashi et al. |
| 2015/0145600 | A1 | 5/2015 | Hur et al. |
| 2016/0241202 | A1 | 8/2016 | Lehtola et al. |
| 2017/0019071 | A1 | 1/2017 | Kobayashi et al. |
| 2017/0019072 | A1 | 1/2017 | Kobayashi et al. |
| 2017/0244366 | A1 | 8/2017 | Hellberg et al. |
| 2018/0278214 | A1 | 9/2018 | Jin et al. |
| 2021/0408972 | A1* | 12/2021 | Watkins ................ H03F 1/3229 |
| 2024/0297620 | A1* | 9/2024 | Jin ............................ H03F 1/42 |

FOREIGN PATENT DOCUMENTS

| | | | | |
|---|---|---|---|---|
| CN | 106575947 | A | 4/2017 | |
| EP | 2141798 | B1 | 7/2011 | |
| JP | 2008035487 | A | 2/2008 | |
| JP | 2012075193 | A | 4/2012 | |
| JP | 2016144015 | A | 8/2016 | |
| KR | 20070015719 | A | 2/2007 | |
| KR | 20110085340 | A | 7/2011 | |
| KR | 20160070783 | A | 6/2016 | |
| WO | WO-2004105339 | A3 * | 5/2005 | .............. H04B 7/04 |
| WO | 2006066461 | A1 | 6/2006 | |
| WO | 2008136080 | A1 | 11/2008 | |
| WO | 2015077497 | A1 | 5/2015 | |
| WO | WO-2021228396 | A1 * | 11/2021 | ........... H03F 1/0222 |

OTHER PUBLICATIONS

First Office Action for Chinese Patent Application No. 201811417441.6, mailed Jul. 3, 2024, 20 pages.
Notice of Reason for Rejection for Japanese Patent Application No. 2018216987, mailed Nov. 15, 2022, 6 pages.
Decision to Grant for Japanese Patent Application No. 2018216987, mailed Apr. 7, 2023, 5 pages.
Examination Report for European Patent Application No. 18204547.6, mailed Sep. 14, 2022, 7 pages.
Written Decision on Registration for Korean Patent Application No. 1020180149302, mailed Nov. 28, 2023, 7 pages.
Cao, Y. et al., "Load Modulated Balanced Amplifier with Reconfigurable Phase Control for Extended Dynamic Range," 2019 IEEE/MTT-S International Microwave Symposium, Jun. 2-7, 2019, Boston, MA, USA, IEEE, pp. 1335-1338.
Examination Report for German Patent Application No. 102022125498.5, mailed Jun. 22, 2023, 16 pages.
Andersson, K., et al., "GaN Powers Microwave Point-to-Point Radios," Microwave Journal, vol. 60, No. 2, Feb. 2017, pp. 22-34.
Collins, D.J., "The Orthogonal LMBA: A Novel RFPA Architecture With Broadband Reconfigurability," IEEE Microwave and Wireless Components Letters, vol. 30, No. 9, Sep. 2020, first published Jul. 2020, IEEE, pp. 888-891.
Kobayashi, K. W., et al., "An 18-21 GHz InP DHBT Linear Microwave Doherty Amplifier," 2000 IEEE Radio Frequency Integrated Circuits (RFIC) Symposium, Jun. 10-13, 2000, Boston, Massachusetts, USA, pp. 179-182.
Kobayashi, K. W., et al., "Indium Phosphide Heterojunction Bipolar Transistor Technology for Future Telecommunications Applications," Microwave Journal, Jul. 1999, 12 pages.
Pednekar, P. H., et al., "RF-Input Load Modulated Balanced Amplifier," 2017 IEEE MTT-S International Microwave Symposium (IMS), Jun. 4-9, 2017, Honolulu, Hawaii, USA, 4 pages.
Shepphard, D. J., et al., "An Efficient Broadband Reconfigurable Power Amplifier Using Active Load Modulation," IEEE Microwave and Wireless Components Letters, vol. 26, No. 6, Jun. 2016, pp. 443-445.
Shepphard, D. J., et al., "A Broadband Reconfigurable Load Modulated Balanced Amplifier (LMBA), " 2017 IEEE MTT-S International Microwave Symposium (IMS), Jun. 4-9, 2017, Honolulu, Hawaii, USA, 3 pages.
Non-Final Office Action for U.S. Appl. No. 15/884,605, mailed Feb. 11, 2019, 6 pages.
Final Office Action for U.S. Appl. No. 15/884,605, mailed Mar. 18, 2019, 6 pages.
Extended European Search Report for European Patent Application No. 18204547.6, mailed May 16, 2019, 7 pages.
Examination Report for European Patent Application No. 18204547.6, mailed Mar. 4, 2021, 6 pages.
Notice of Preliminary Rejection for Korean Patent Application No. 10-2018-0149302, mailed Sep. 25, 2023, 9 pages.
Rusanen, J. et al., "Ka-Band Orthogonal Load-Modulated Balanced Amplifier in 22 nm CMOS FDSOI," Proceedings of the 17th European Microwave Inegrated Circuits Conference, Sep. 26-27, 2022, Milan, Italy, IEEE, pp. 161-164.

* cited by examiner

AUTONOMOUS ANALOG ORTHOGONAL LOAD MODULATION POWER AMPLIFIER

RELATED APPLICATIONS

This application claims the benefit of provisional patent application Ser. No. 63/254,243, filed Oct. 11, 2021, the disclosure of which is hereby incorporated herein by reference in its entirety.

FIELD OF THE DISCLOSURE

The present disclosure pertains to amplifiers and in particular to load modulation amplifiers having a carrier amplifier and a peak amplifier coupled in parallel.

BACKGROUND

Traditional Doherty power amplifiers have been used to improve high output power backed off efficiency over a wide power range. Moreover, quadrature combined load modulation power amplifiers offer broader bandwidth and load modulation capability compared with a traditional Doherty power amplifier. Further still, active and passive load modulation amplifiers and balanced and unbalanced bias and non-50 ohm terminated load modulation amplifiers based on quadrature output combining are also available. However, load modulated balanced amplifiers (LMBAs) require a second input signal source, which contributes significant added direct current power and is enabled by an externally generated control signal power. A simplified LMBA that requires no external control signal has been reported. However, the simplified LMBA may simplify operation the simplified LMBA has a disadvantage of requiring an additional active amplifier and feedforward radio frequency (RF) path that restricts certain desirable applications. Orthogonal LMPAs (OLMPAs) reduce the power requirement of the second input signal source, but OLMPAs still require dynamic changes in phase and amplitude vs. signal power and/or frequency to realize continuous power backed off (PBO) efficiency operation versus power. Thus, a need remains for a single RF input and output power amplifier implementation that does not require the need for external phase or amplitude control signals nor dual RF input signals while achieving high continuous PBO efficiency.

SUMMARY

A load modulation amplifier is disclosed having a first amplifier and a second amplifier. An input quadrature coupler has a first port, a second port, a third port, and a fourth port, wherein the third port is coupled to an input of the second amplifier and the fourth port is coupled to an input of the first amplifier. An output quadrature coupler has a first port, a second port, a third port, and a fourth port, wherein the first port is coupled to an output of the second amplifier and the second port is coupled to an output of the first amplifier. A splitter has a first splitter output, a splitter input coupled to a signal input, and a second splitter output coupled to the second port of the input quadrature coupler, and a variable attenuator coupled between the first splitter output and the first port of the input quadrature coupler. An attenuation controller has a controller output that is coupled to an attenuation control input of the variable attenuator, wherein the attenuation controller autonomously generates a control signal in response to a power sample signal in proportion to a radio frequency signal received at the radio frequency signal input.

In exemplary embodiments, the disclosed load modulation amplifier is an autonomous analog orthogonal load modulated balanced amplifier (A-OLMPA) made up of the first amplifier and the second amplifier that are output-combined by the output quadrature coupler that is a Lange-type four-port coupler. The isolation port of the output quadrature coupler is typically reflective (open or short) and may be complex but not ideally an absorptive characteristic impedance (50Ω) in order to enable enhanced power backed off (PBO) efficiency operation. Drain voltage modulation and/or asymmetric bias may be used to further enhance PBO gain, linearity, and/or power-added efficiency response of the amplifier. To provide a single radio frequency input and output and autonomous operation, with no requirement for an externally controlled chip-scale packaging, the disclosed amplifier provides for splitting the radio frequency input signal through a Wilkinson splitter in at least one embodiment and analog power detection and input power amplitude control through the variable attenuator that drives an orthogonal quadrature amplifier input path for achieving enhanced PBO efficiency. A fixed delay or phase may be used in either input path to optimize operation. The output termination may include a complex reflective impedance for optimizing general PBO operation over frequency or power. The disclosed A-OLMPA can provide optimum output PBO efficiency similar to the more complex dual-driven load-modulated balanced amplifiers without requiring an externally generated phase and amplitude-controlled input signal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Disclosed is single radio frequency (RF) input and output power amplifier implementation that does not require external phase or amplitude control signals nor dual RF input signals while achieving high continuous power backed off (PBO) efficiency.

The disclosed power amplifier includes an input splitter and analog power detector and attenuation means for configuring a single-ended input and output high PBO power-added efficiency (PAE) power amplifier conducive of autonomous operation without an externally generated phase- and amplitude-controlled RF signal.

Figure 1A:
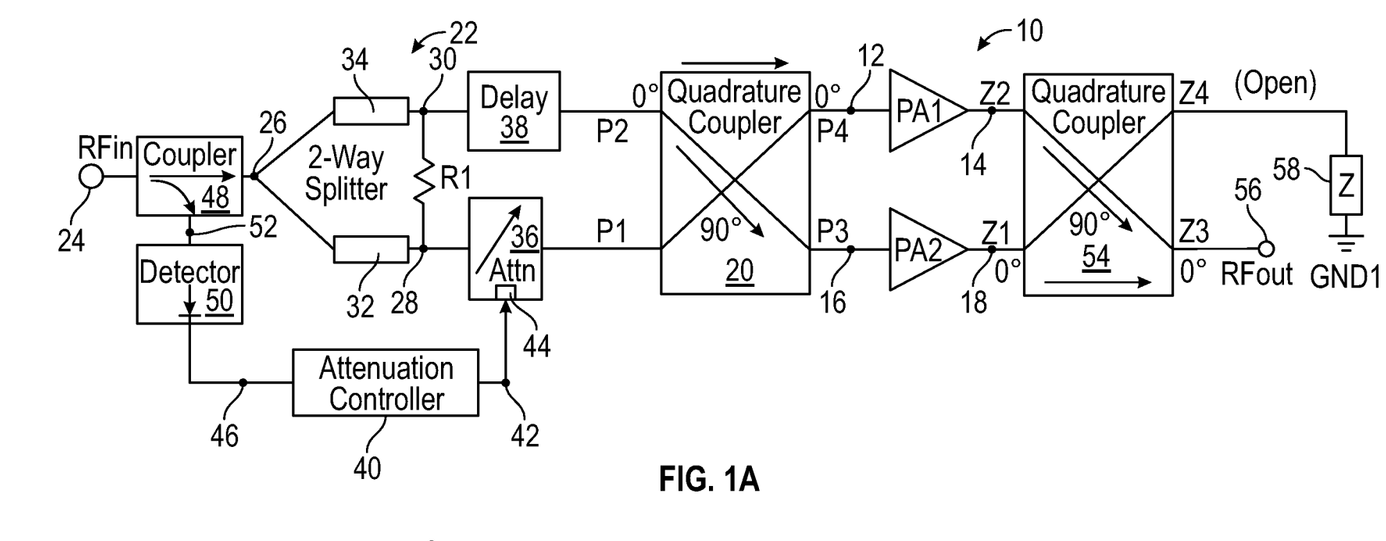
FIG. 1A is a schematic of a first exemplary embodiment of an analog orthogonal load modulation power amplifier (A-OLMPA) that is structured according to the present disclosure.

FIG. 1A is a schematic of a first exemplary embodiment of an analog orthogonal load modulation power amplifier (A-OLMPA) 10 that is structured according to the present disclosure. The A-OLMPA 10 has a first power amplifier PA1 with a first input 12 and a first output 14. A second power amplifier PA2 has a second input 16 and a second output 18. An input quadrature coupler 20 has a first port P1, a second port P2, a third port P3, and a fourth port P4. The first input 12 of the first amplifier PA1 is coupled to the fourth port P4, and the second input 16 of second amplifier PA2 is coupled to the third port P3.

A two-way splitter 22 is configured to divide a RF signal arriving at an RF input 24 into two portions. The RF input 24 is labeled RFin in FIG. 1A. The two-way splitter 22 has a splitter input 26 coupled to the RF input 16, and a first splitter output 28 coupled to the first port P1, and a second splitter output 30 coupled to the second port P2. In this exemplary embodiment, the two-way splitter 22 is a Wilkinson splitter having a first quarter-wave microstrip 32 coupled between the splitter input 26 and the first splitter output 28 and a second quarter-wave microstrip 34 coupled between the splitter input 26 and the second splitter output 30. An isolation resistor R1 is coupled between the first splitter output 28 and the second splitter output 30.

A variable attenuator 36 is coupled between the first splitter output 28 and the first port P1. The variable attenuator 36 may be of the analog type that is controlled by an analog control signal such as a direct current control signal that includes a voltage level and/or current level. The variable attenuator 36 may include active devices such as field-effect transistors.

A delay element 38 is coupled between the second splitter output 30 and the second port P2. The delay element 38 is configured to maintain substantially zero phase difference between split portions of the RF signal due to the variable attenuator 28.

An attenuation controller 40 has a controller output 42 that is coupled to an attenuation control input 44 of the variable attenuator 40. The attenuation controller 40 has a power sample signal input 46 through which a power sample signal representing a power signal associated with the RF signal is received.

In this regard, the power sample signal may be generated externally by an external processor (not shown). However, in the exemplary embodiment of FIG. 1A, the power sample signal is provided by an RF coupler 48 and an RF detector 50. The RF coupler 48 is coupled between the RF input terminal 24 and the splitter input 26. The RF coupler 48 has a sample output 52 through which an RF sample flows. The RF detector 50 is coupled between the sample output 52 and the power sample signal input 46. The RF detector 50 is configured to generate a power sample signal Vdet in proportion to the RF signal or the RF sample flowing from the sample output 52 of the RF coupler 48. The RF coupler 48 may be but is not limited to microstrip directional couplers. The RF detector 50 may be but is not limited to Schottky diode-based detector circuits. The attenuation controller 40 may be but is not limited to analog circuitry configured to generate an attenuation control signal that is provided through the controller output 42. In some embodiments, the attenuation controller 40 is configured to amplify the power sample signal Vdet, and/or level shift the power sample signal Vdet, and/or filter the power sample signal Vdet. Alternative embodiments of the attenuation controller 40 may be a digital processor interfaced to a look-up table containing attenuation values versus power sample signal magnitude.

An output quadrature coupler 54 has a first port Z1, a second port Z2, a third port Z3, and a fourth port Z4. The first amplifier output 14 of the first amplifier PA1 is coupled to the second port Z2 of the output quadrature coupler 54, and the second amplifier output 18 is coupled to the first port Z1 of the output quadrature coupler 54. The third port Z3 is coupled to an RF output 56 that is labeled RFout in FIG. 1A. A termination impedance 58 labeled Z is coupled between the fourth port Z4 of the output quadrature coupler 54 and a fixed voltage node GND1, which in this case is ground. The termination impedance 58 is an open in the embodiment depicted in FIG. 1A. However, in another embodiment the termination impedance 58 is a short. In yet another embodiment, the termination impedance 58 is reflective complex impedance having both substantially resistive and substantially reactive parts. The reactive portion may be used to tune bandwidth for desired operation. In further embodiments, the termination impedance 58 has a non-50 ohm real part that is either greater than 0 and less than 35 ohm or greater than 75 ohm.

Figure 1B:
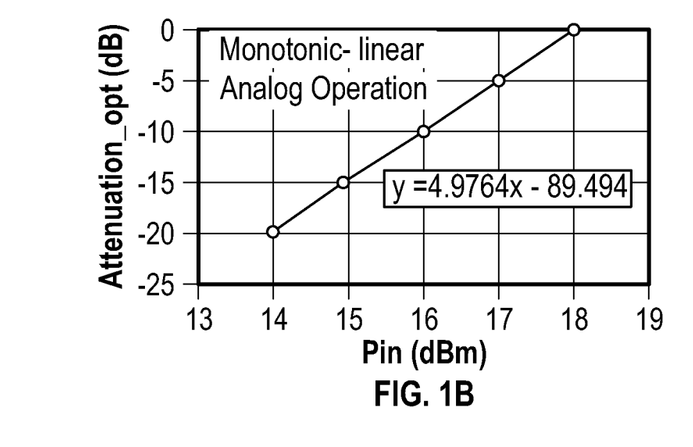
FIG. 1B that is a graph of optimal attenuation versus input power.

The A-OLMPA 10 generally operates as a balanced amplifier wherein first power amplifier PA1 and second power amplifier PA2 have substantially the same quiescent bias. The two-way splitter 22 is used to create two in-phase input signals to the first port P1, which is a 90 degree orthogonal input, and the second port P2, which is a 0 degree in-phase input of the input quadrature coupler 20. The two-way splitter 22 provides a single-ended input and output operation configuration for the A-OLMPA 10 as opposed to a traditional dual-driven amplifier with two different RF inputs. An orthogonal input path includes the variable attenuator 36 that feeds the first port P1 that is an orthogonal input of the input quadrature coupler 20. This may be optionally followed by a fixed phase shifter component for aligning and centering the power amplifier efficiency operation per frequency, bandwidth, or PBO. The delay element 38 may optionally be used in the in-phase input path to compensate for the delay introduced by the variable attenuator 36. To create maximum efficiency over bias supplied to the A-OLMPA 10, a linear in decibel-to-decibel attenuation with respect to RF input power, Pin, can be established and applied to the variable attenuator 36. This is accomplished by sampling the RF input power through the RF coupler 48 followed by the RF detector 50 that provides a monotonic detection voltage (vs. Pin) and then is shaped, DC level shifted by the attenuation controller 40, and applied to an variable attenuator 36 that follows the simple linear attenuation vs. Pin characteristic for providing best PAE over Pin. Please see FIG. 1B that is a graph of optimal attenuation (Attenuation_opt) versus input power Pin. Notice the relatively high linear relationship between the optimal attenuation and input power Pin.

Figure 2:
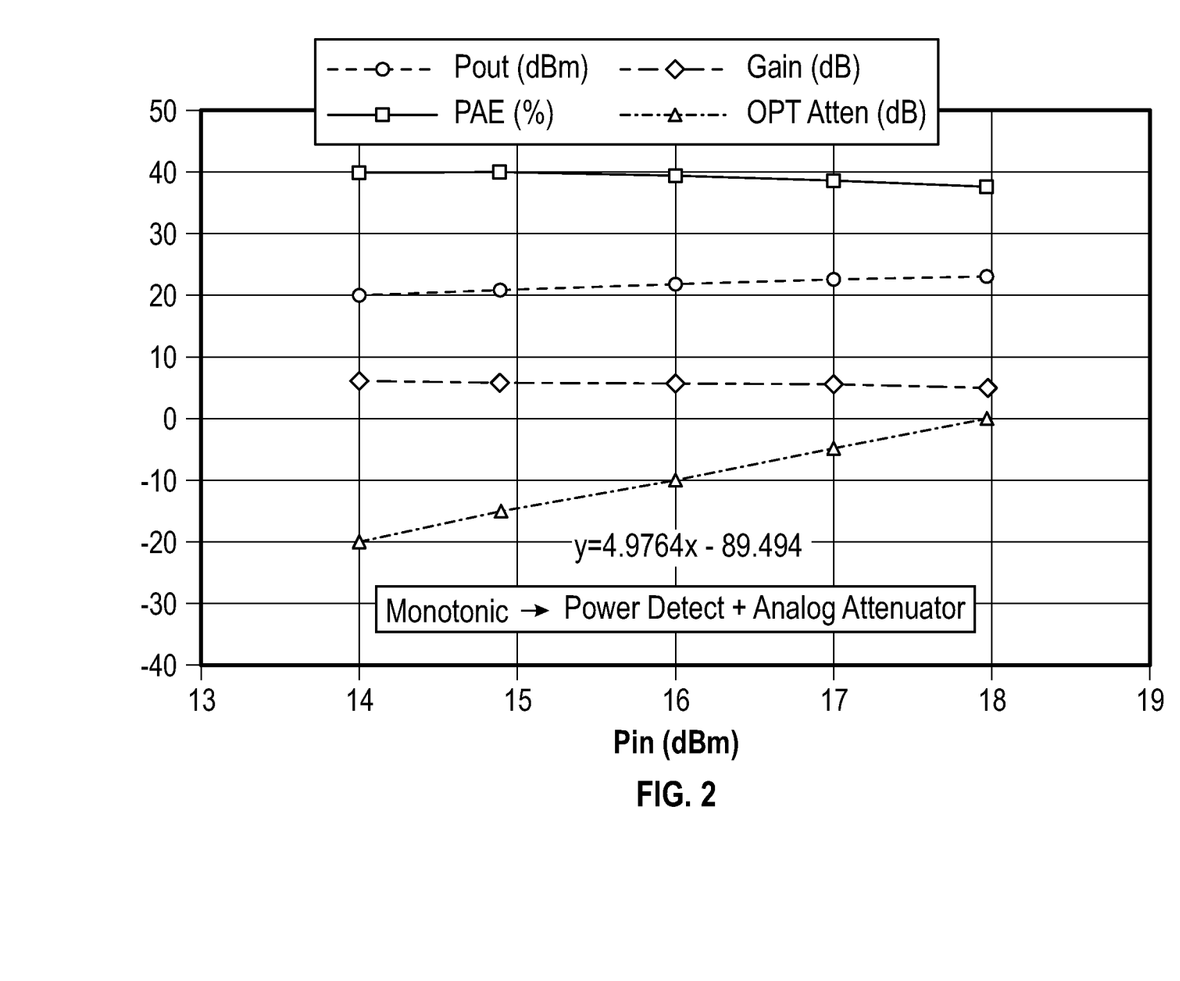
FIG. 2 is a graph showing the output power, power-added efficiency (PAE), and gain response versus input power and the corresponding optimum attenuation required versus input power step.

FIG. 2 is a graph showing the Pout, PAE, and gain response vs. Pin and the corresponding optimum attenuation required vs. Pin power step. The optimum attenuation required for maximum PAE over Pin is monotonic and linear. This aspect enables the A-OLMPA 10 to be analog operated autonomously without requiring external digital control settings for phase and amplitude over power and frequency.

Figure 3A:
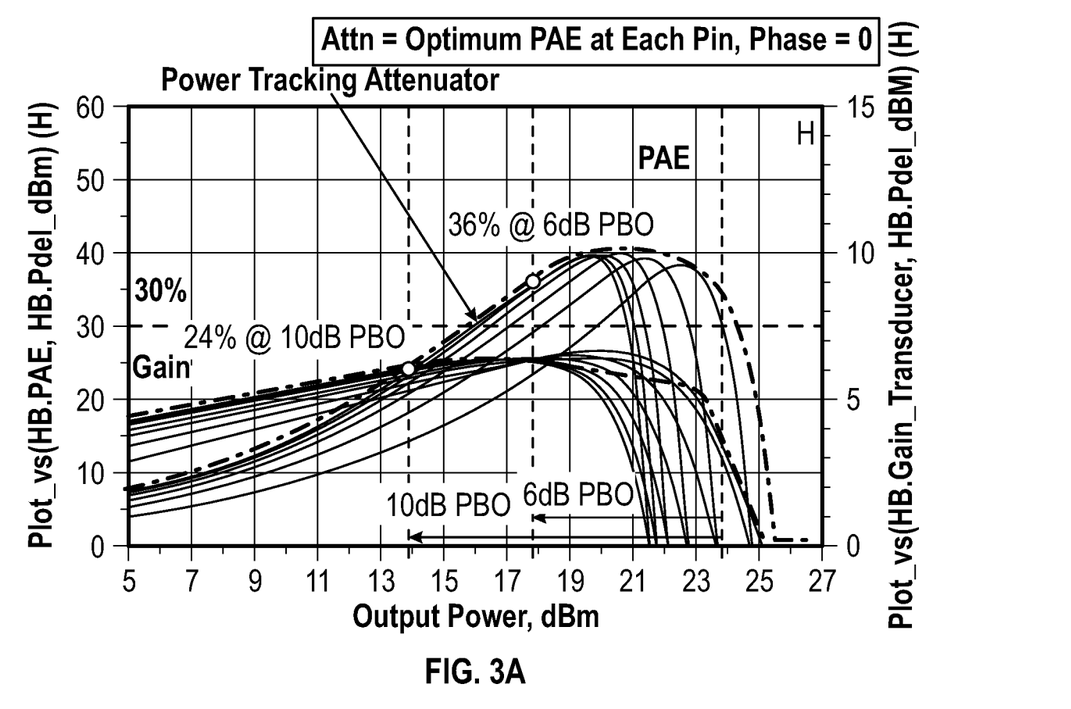
FIG. 3A shows responses of the embodiment of the A-OLMPA depicted FIG. 1A as the A-OLMPA operates continuously and autonomously while employing the optimum PAE attenuation function modeled in FIG. 2.
Figure 3B:
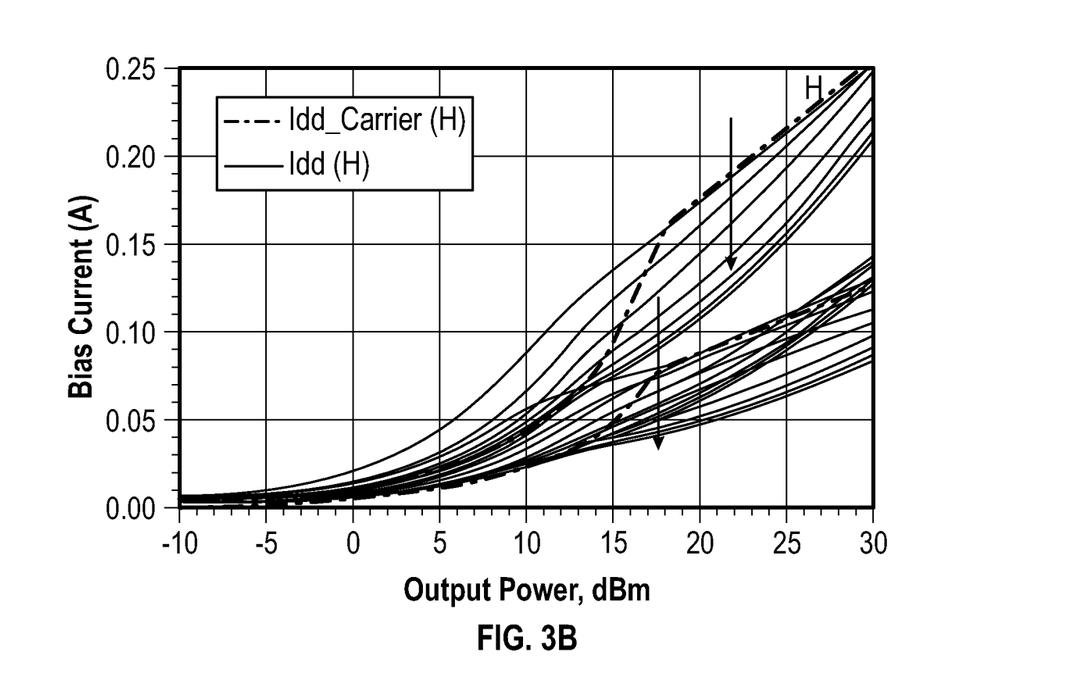
FIG. 3B is a graph of bias currents for the first amplifier PA1 that is the carrier amplifier and the second amplifier PA2 that is the peak amplifier versus output power.

FIG. 3A shows responses in dot-dash lines of the embodiment of the A-OLMPA 10 depicted FIG. 1A as the A-OLMPA 10 operates continuously and autonomously with the RF coupler 48, the RF detector 50, and the variable attenuator 36 employing the optimum PAE attenuation function modeled in FIG. 2. FIG. 3B is a graph of bias currents for the first amplifier PA1 that is the carrier amplifier and the second amplifier PA2 that is the peak amplifier versus output power. FIGS. 3A and 3B illustrate that the simple linear relationship for optimum PAE attenuation vs. Pin can easily be modeled by a straight line as shown in FIG. 2. Similarly, this optimizing analog attenuation methodology may be applied to optimum amplitude modulation-amplitude modulation (AM-AM) or isotropic linear gain operation.

Figure 4A:
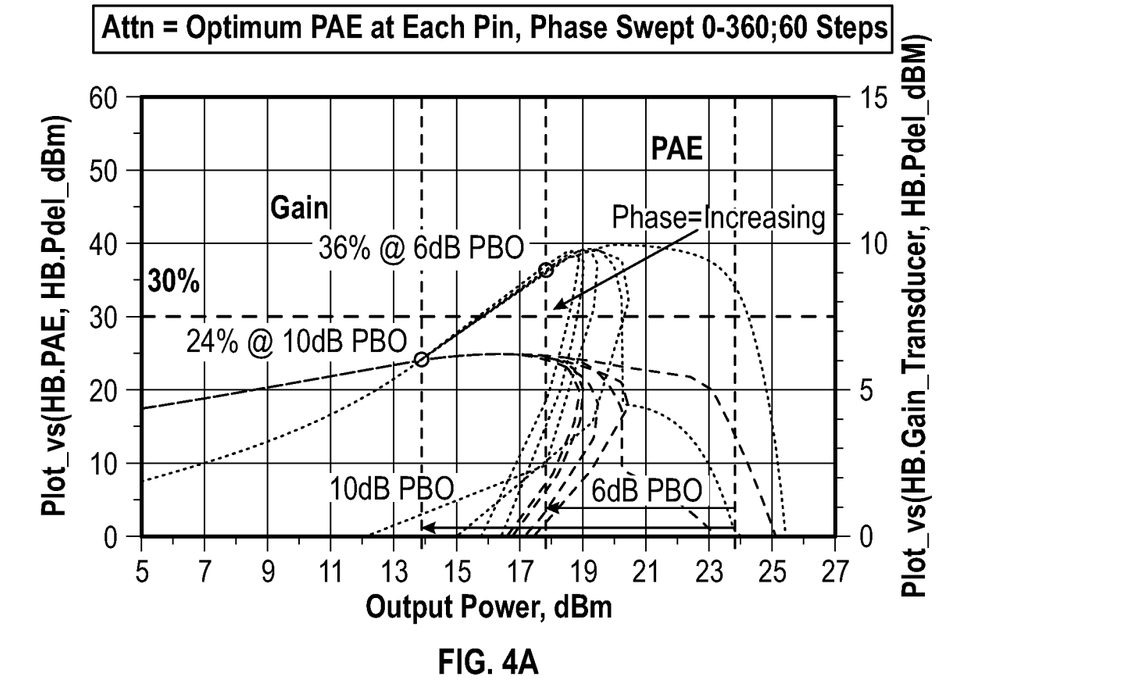
FIG. 4A is a graph that illustrates responses from sweeping the phase (0→360) for the variable attenuator tracking the maximum PAE analog attenuation expression given in FIG. 2.
Figure 4B:
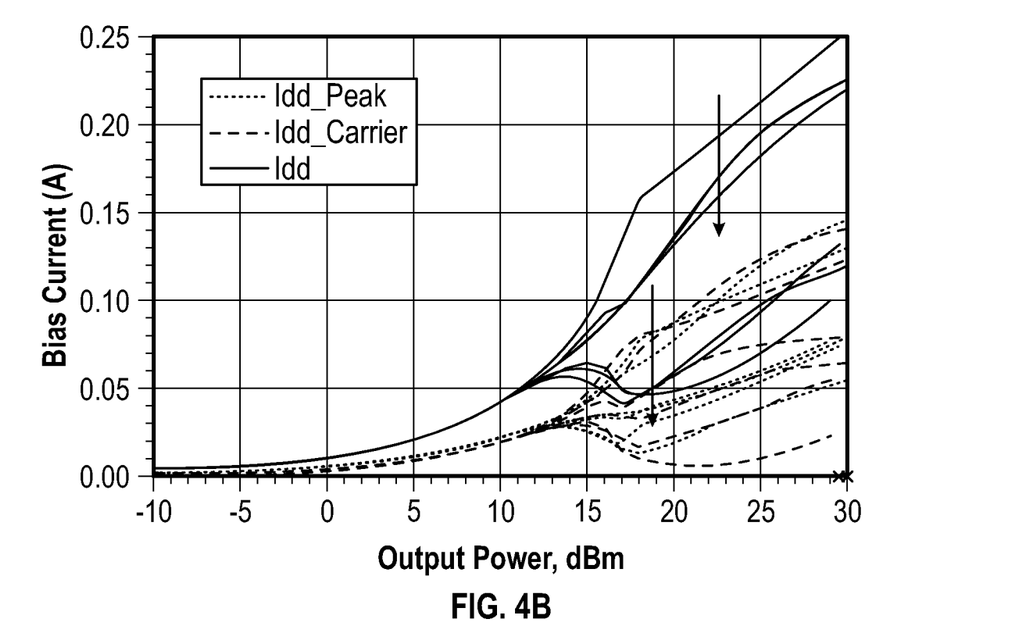
FIG. 4B is a graph of bias current for the first amplifier P1 and the second amplifier P2 versus output power.

FIG. 4A is a graph that illustrates responses from sweeping the phase (0→360) for the variable attenuator 36 tracking the maximum PAE analog attenuation expression given in FIG. 2. FIG. 4A shows that the optimum phase for achieving maximum PAE is zero and constant over power. Thus, little or no improvement in PAE is obtained from adjusting the phase over power. The simulations suggest that the optimum PAE may be achieved by only employing a simple analog attenuator with a fixed optimum phase of substantially zero when the termination is substantially an OPEN. Because the optimum PAE attenuation vs. Pin follows a well-behaved monotonic linear function, continuous and autonomous high PBO operation is relatively easily implemented. FIG. 4B is a graph of bias current for the first amplifier P1 and the second amplifier P2 versus output power.

Figure 5A:
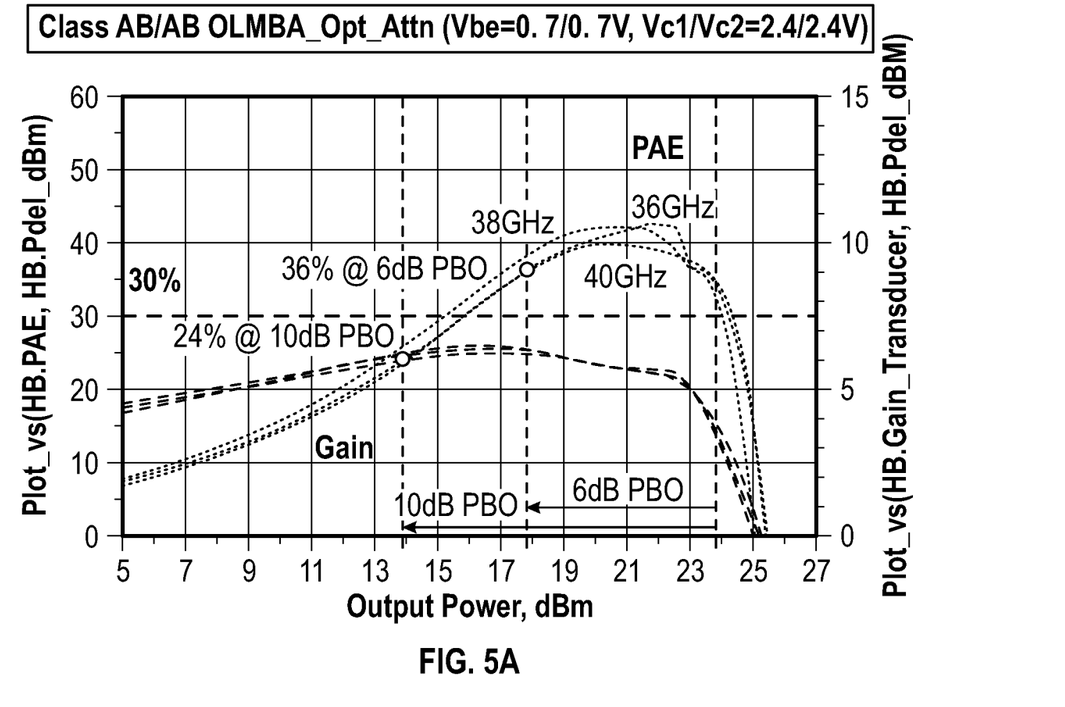
FIG. 5A illustrates the response from sweeping frequency 36 GHz to 40 GHz for the embodiment of FIG. 1A where the analog attenuator is tracking the maximum PAE analog attenuation expression given in FIG. 2.
Figure 5B:
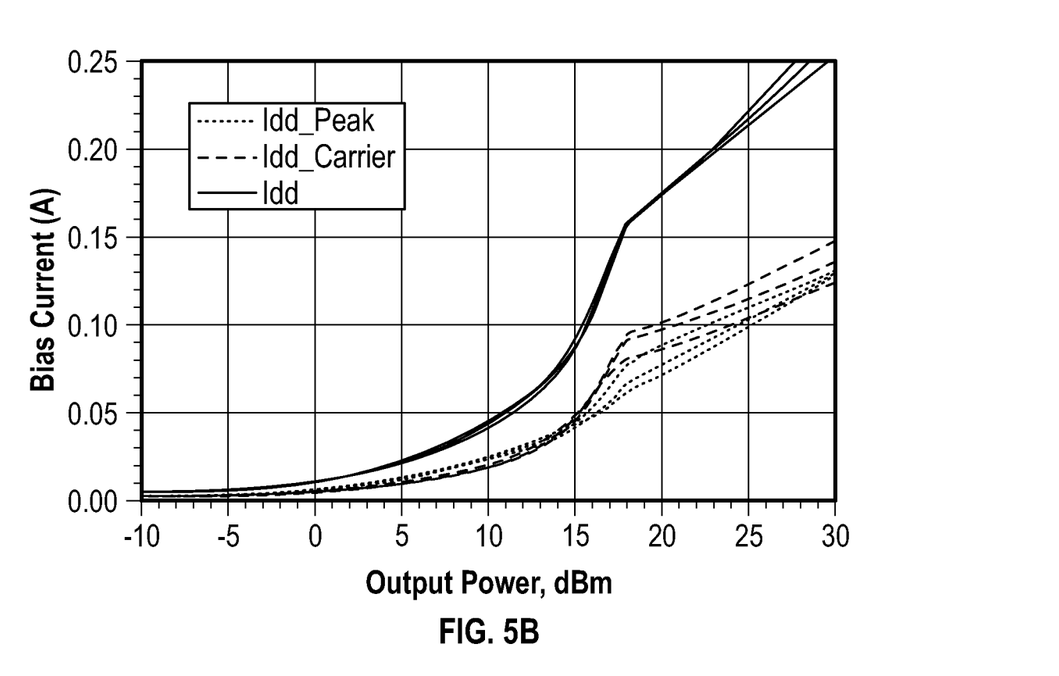
FIG. 5B is a graph of bias current for the first amplifier and the second amplifier versus output power.

FIG. 5A illustrates the response from sweeping frequency 36 GHz to 40 GHz for the embodiment of FIG. 1A where the analog attenuator is tracking the maximum PAE analog attenuation expression given in FIG. 2. FIG. 5B is a graph of bias current for the first amplifier PA1 and the second amplifier PA2 versus output power. These responses indicate that the A-OLMPA maximum PAE response is well behaved over frequency bandwidth and that the same optimum PAE attenuation expression is applicable over bandwidth.

Figure 6A:
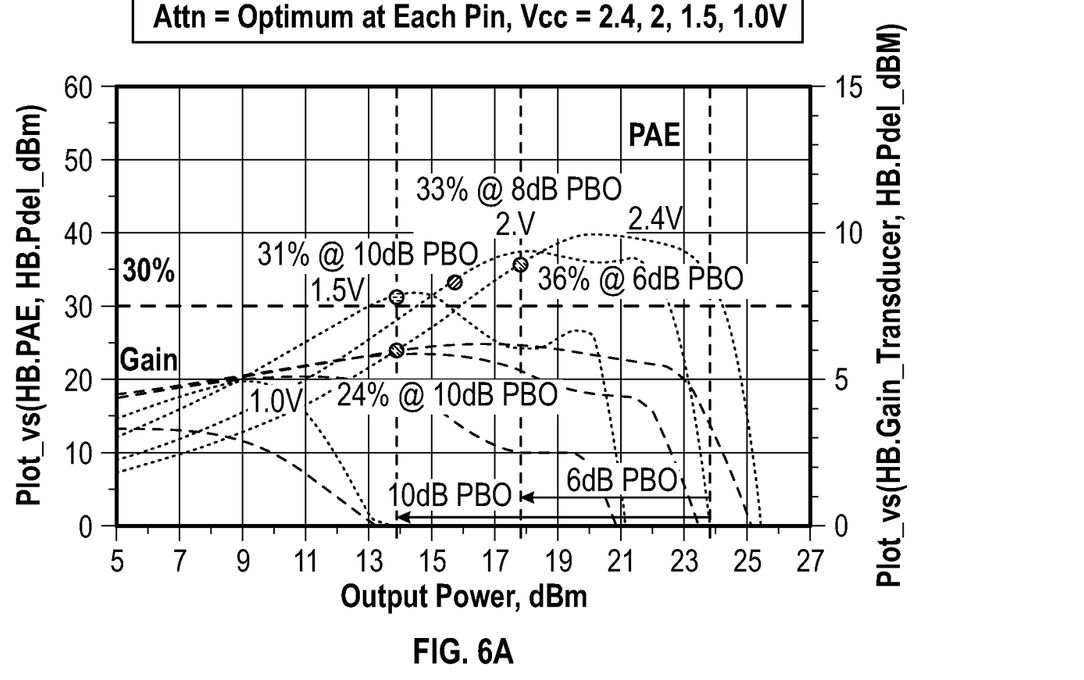
FIG. 6A illustrates the response from applying supply modulation to the A-OLMPA.
Figure 6B:
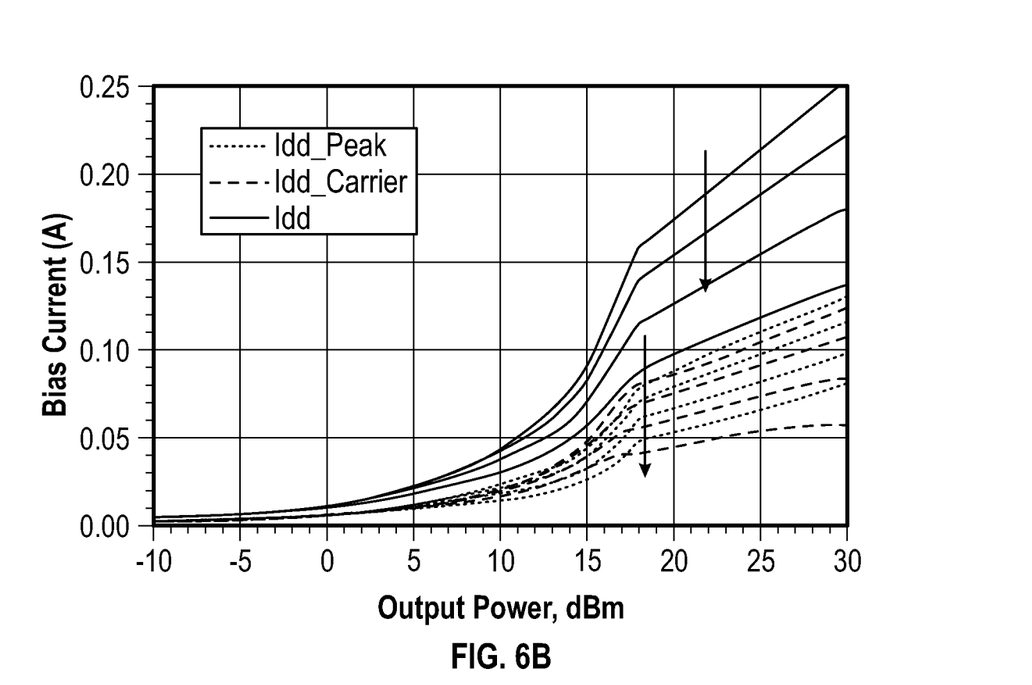
FIG. 6B is a graph of bias current for the first amplifier PA1 and the second amplifier PA2 versus output power.

FIG. 6A illustrates the response from applying supply modulation to the A-OLMPA 10. FIG. 6A shows that the 10 dB PBO PAE of 24% can be improved to 31% by applying drain modulation. Thus, the topology of the A-OLMPA 10 with analog attenuation tracking is conducive of hybrid operation using supply modulation techniques. However, continuous and autonomous hybrid operation can occur since the A-OLMPA 10 operates in a continuous analog mode without digital control assistance. FIG. 6B is a graph of bias current for the first amplifier PA1 and the second amplifier PA2 versus output power.

Figure 7A:
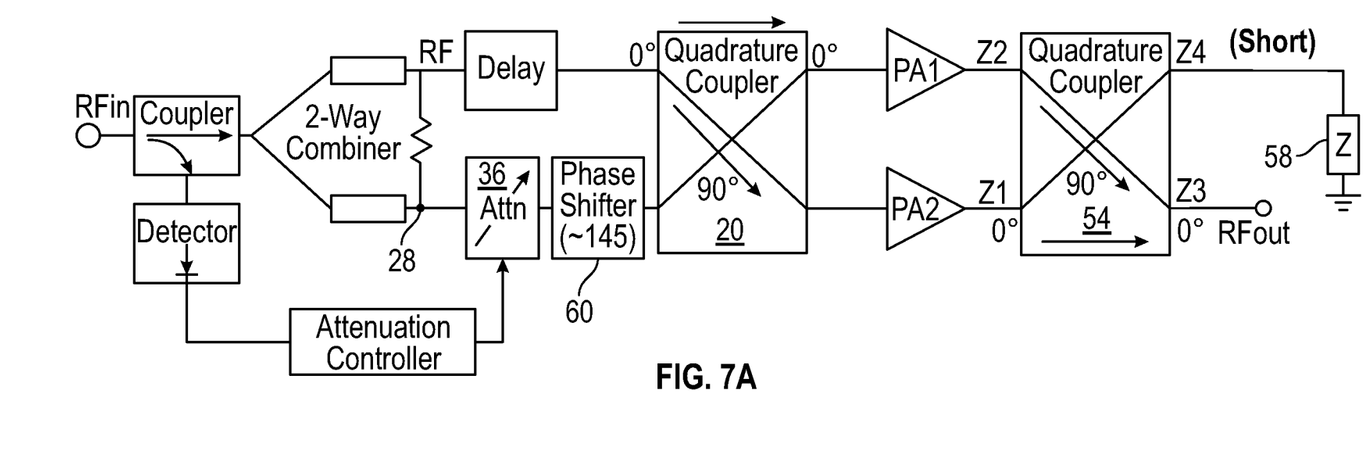
FIG. 7A is a schematic of an embodiment of the A-OLMPA that is similar to FIG. 1A except that the termination impedance is a short instead of an open and a phase shifter is included to maximize PAE.
Figure 7B:
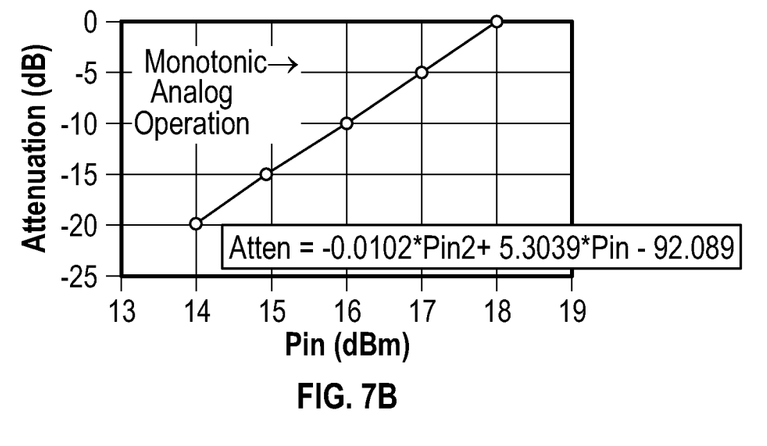
FIG. 7B that is a graph of optimal attenuation versus input power.

FIG. 7A is a schematic of an embodiment that is similar to FIG. 1A except that the termination impedance 58 is a short instead of an open, and a phase shifter 60 is coupled between the first splitter output 28 and the first port P1 of the input quadrature coupler 20. For optimum operation, the optimum fixed phase shift generated by the phase shifter 60 ranges between 130 degrees and 180 degrees. A value of 145 degrees is optimal when using the same maximum PAE attenuation expression given in FIG. 7B. In one exemplary embodiment of the A-OLMPA 10, the phase shifter 60 is fixed at substantially 0 degrees when the fourth port Z4 of the output quadrature coupler 54 is substantially terminated as an open. In another exemplary embodiment of the A-OLMPA 10, the phase shifter 60 is fixed at substantially 145 degrees when the fourth port Z4 of the output quadrature coupler 54 is substantially terminated as a short by way of the termination impedance 58. In yet other embodiments, the phase shifter generates a phase shift between 0 degrees and 130 degrees.

Figure 8A:
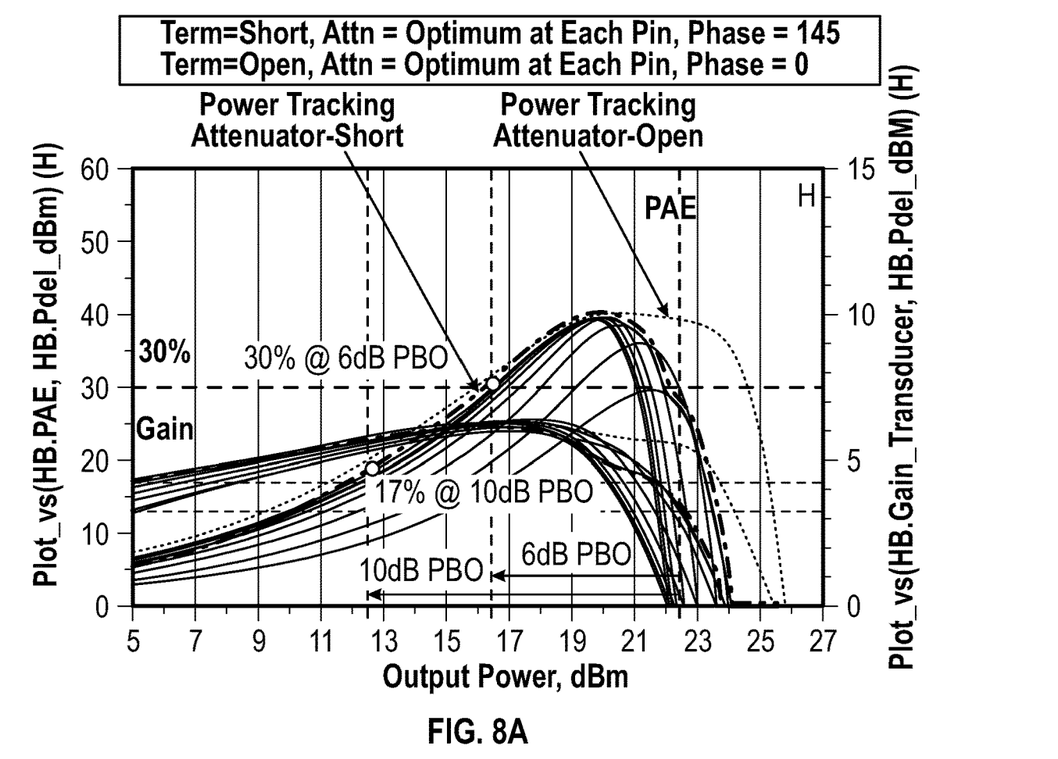
FIG. 8A is a graph depicting responses of the embodiment of FIG. 7A regarding PAE and output power.
Figure 8B:
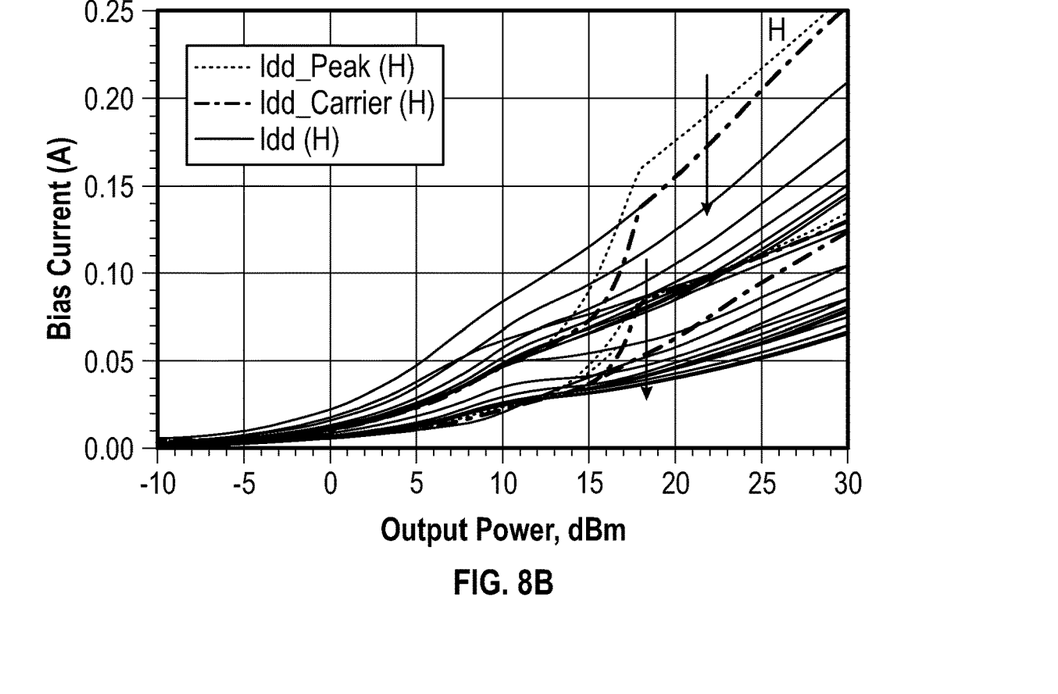
FIG. 8B is a graph of bias current for the first amplifier PA1 and the second amplifier PA2 versus output power for the embodiment of FIG. 7A.

FIGS. 8A and 8B are graphs depicting responses of the embodiment of FIG. 7A wherein the fourth port Z4, which is the termination port of the output quadrature coupler 54 is a SHORT, the orthogonal phase shift is 145 degrees, and the same optimum PAE attenuation expression of FIG. 2 is used. The bold dot-dash curve of FIG. 8A follows the envelope of the family of PAE curves (solid lines), suggesting that the same optimum PAE attenuation expression can be used for both open and short termination cases. However, the SHORT termination depicts a lower PBO PAE range compared with the OPEN termination embodiment of FIG. 1A. However, the A-OLMPA 10 was tuned specifically for the OPEN termination case and not the SHORT termination case. However, it is to be understood that the same maximum PAE attenuation expression vs. power is applicable to both the OPEN and SHORT termination cases which may facilitate reconfiguration when desired. FIG. 8B is a graph of bias current for the first amplifier PA1 and the second amplifier PA2 versus output power.

In some embodiments, the A-OLMPA 10 is configured to receive a modulated supply voltage from a modulation power supply such as envelope tracking circuitry. In some embodiments, the second amplifier PA2 that is a peak amplifier is configured to operate from a peak supply voltage that is greater than the carrier supply voltage when the termination impedance 58 is substantially open and the variable attenuator 36 provides an attenuation of greater than 3 dB. In other embodiments the first amplifier PA1 that is a carrier amplifier is configured to operate from a carrier supply voltage that is greater than the peak supply voltage when the termination impedance 58 is substantially short and the variable attenuator 36 provides an attenuation of greater than 3 dB.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A load modulation amplifier comprising:
a first amplifier having a first input and a first output;
a second amplifier having a second input and a second output;
an input quadrature coupler having a first port, a second port, a third port, and a fourth port, wherein the third port of the input quadrature coupler is coupled to the second input of the second amplifier and the fourth port of the input quadrature coupler is coupled to the first input of the first amplifier;
an output quadrature coupler having a first port, a second port, a third port, and a fourth port, wherein the first port of the output quadrature coupler is coupled to the second output of the second amplifier and the second port of the output quadrature coupler is coupled to first output of the first amplifier;
a splitter having a first splitter output, a splitter input coupled to a radio frequency (RF) signal input, and a second splitter output coupled to the second port of the input quadrature coupler;
a variable attenuator coupled between the first splitter output and the first port of the input quadrature coupler; and
a termination impedance coupled to the fourth port of the output quadrature coupler, wherein the termination impedance is a reflective complex impedance having a non-50 ohm real part that is either greater than 0 and less than 35 ohm or greater than 75 ohm.

2. The load modulation amplifier of claim 1 further comprising an attenuation controller having a controller output that is coupled to an attenuation control input of the variable attenuator, wherein the attenuation controller autonomously generates a control signal in response to a power sample signal in proportion to an RF signal received at the RF signal input.

3. The load modulation amplifier of claim 2 wherein the attenuation controller is an analog conditioning circuit that is configured to amplify the power sample signal.

4. The load modulation amplifier of claim 2 wherein the attenuation controller is an analog conditioning circuit that is configured to level shift the power sample signal.

5. The load modulation amplifier of claim 2 wherein the attenuation controller is an analog conditioning circuit that is configured to filter the power sample signal.

6. The load modulation amplifier of claim 2 wherein the attenuation controller is an analog conditioning circuit that is configured to amplify, level shift, and filter the power sample signal.

7. The load modulation amplifier of claim 2 further comprising an RF coupler that is coupled between the RF input and the splitter input.

8. The load modulation amplifier of claim 3 further comprising an RF detector coupled between an output on the RF coupler and an input of the attenuation controller.

9. The RF detector of claim 3 wherein the detector creates a voltage control signal that is linear in voltage with respect to the RF coupled and detected input power in dBm.

10. The load modulation amplifier of claim 1, wherein voltage supplying the second amplifier is greater than the voltage supplying the first amplifier when the termination impedance is substantially a shorted impedance.

11. The load modulation amplifier of claim 10, wherein the attenuation is greater than 3 dB.

12. The load modulation amplifier of claim 1 further comprising a phase shifter coupled between the variable attenuator and the first port of the quadrature coupler.

13. The load modulation amplifier of claim 12 wherein the phase shifter generates a phase shift between 0 degrees and 130 degrees.

14. The load modulation amplifier of claim 12 wherein the phase shifter generates a phase shift between 130 degrees and 180 degrees.

15. The load modulation amplifier of claim 12 wherein the phase shifter generates a phase shift of substantially 0 degrees when the termination impedance is substantially an open impedance.

16. The load modulation amplifier of claim 12 wherein the phase shifter generates a phase shift of substantially 145 degrees when the termination impedance is substantially a shorted impedance.

17. The load modulation amplifier of claim 1 wherein first power amplifier and second power amplifier are configured to have substantially the same quiescent bias.

18. The load modulator amplifier of claim 1 further comprising a delay element that is coupled between the second splitter output and the second port of the input quadrature coupler, wherein the delay element is configured to maintain substantially zero phase difference between split portions of an RF signal due to a delay introduced by the variable attenuator.

19. The load modulation amplifier of claim 1 wherein at least one of the first amplifier and the second amplifier is further configured to receive a modulated supply voltage from a modulation power supply.

20. The load modulation amplifier of claim 1, wherein voltage supplying the first amplifier is greater than the voltage supplying the second amplifier when the termination impedance is substantially an open impedance.

21. The load modulation amplifier of claim 20, wherein the attenuation is greater than 3 dB.

* * * * *